(12) United States Patent
Huang

(10) Patent No.: US 7,066,977 B2
(45) Date of Patent: Jun. 27, 2006

(54) FLAME SYNTHESIS AND NON-VACUUM PHYSICAL EVAPORATION

(76) Inventor: Fu-Kuo Huang, 1F, No. 15, Fu-Jen St., Tu-Chen City, Taipei Hsien (TW)

(*) Notice: Subject to any disclaimer, the term of this patent is extended or adjusted under 35 U.S.C. 154(b) by 204 days.

(21) Appl. No.: 10/610,637

(22) Filed: Jul. 2, 2003

(65) Prior Publication Data

US 2004/0005414 A1    Jan. 8, 2004

Related U.S. Application Data

(63) Continuation-in-part of application No. 09/846,212, filed on May 2, 2001, now abandoned.

(51) Int. Cl.
*B22F 9/30* (2006.01)

(52) U.S. Cl. .............. 75/343; 75/351; 75/362; 264/5; 427/189; 427/190; 427/191

(58) Field of Classification Search ............... 75/343, 75/351, 362; 427/189, 190, 191; 264/5
See application file for complete search history.

(56) References Cited

U.S. PATENT DOCUMENTS

| 3,932,313 | A | * | 1/1976 | Reynolds et al. ...... 252/520.21 |
| 5,049,371 | A | * | 9/1991 | Rinn et al. ................ 423/592.1 |
| 5,075,090 | A | * | 12/1991 | Lewis et al. ................. 423/337 |
| 5,858,465 | A | * | 1/1999 | Hunt et al. ............... 427/248.1 |
| 5,958,361 | A | * | 9/1999 | Laine et al. .................. 423/610 |
| 6,025,034 | A | * | 2/2000 | Strutt et al. .................. 427/450 |
| 6,761,866 | B1 | * | 7/2004 | James et al. ................. 423/335 |
| 2002/0164282 | A1 | * | 11/2002 | Huang ......................... 423/592 |
| 2004/0052673 | A1 | * | 3/2004 | Huang ........................... 419/45 |

* cited by examiner

*Primary Examiner*—George Wyszomierski
(74) *Attorney, Agent, or Firm*—Rosenberg, Klein & Lee

(57) ABSTRACT

A method for producing fine or ultra fine powder particles comprising mixing a metal alkoxide with a non-metallic hydride in an organic solvent, agitating the mixed solution, and then burning the mixed solution. The burning process comprises igniting the solution directly or burning the solution in situ. A self-sustaining flame will result. When the precursor solution burns, the metallic compound will be co-fired with the organic solvent. As a result, fine or ultra fine particles of mixed metal will burst from the flame, or thrust through the flame and be synthesized.

10 Claims, 2 Drawing Sheets

FLAME SYNTHESIS AND NON-VACUUM PHYSICAL EVAPORATION

CROSS-REFERENCE TO RELATED APPLICATION

This Application is a Continuation-in-Part application of Ser. No. 09/846,212, filed May 2, 2001, now abondoned and entitled "Flame Synthesis and Non-Vacuum Physical Evaporation".

BACKGROUND OF THE INVENTION

1. Field of the Invention

The present invention relates to particle powder synthesis. More specifically, the present invention discloses a method of utilizing sol-gel processing, flame synthesis and non-vacuum physical evaporation to produce high quality fine or ultra fine particle powder.

2. Description of the Prior Art

Traditional approaches of sol-gel processing to produce fine powder particles usually requires the mixed solution containing both precursor and organic solvent be placed in an oven and slowly heated to a temperature slightly higher than the flash point, but lower than the boiling point, of the solvent.

However, the solvent may take more than a month to be completely vaporized. Furthermore, even after such vaporization, only the precursor is obtained, and fine powder particles have not been produced yet. Moreover, a large portion of the precursor along with the solvent will be vaporized during such a long process.

As a heating source is a requisite to such a process, the energy cost is significant. Also, because the processing time is incredibly long, not only the productivity remains low, but also the precursor will clot and cause the grains to grow larger. Thus, the particle quality is poor. Because solvent vaporization is also a requisite to such a process, other disadvantages of such process include low productivity, contamination, air pollution, etc.

Other approaches to produce fine particle powder include solvent vaporization, freeze drying, spray drying, thermal spraying, precipitation, hydro flame drying, etc. However, all of these approaches require higher energy costs, cause air pollution, and still have barriers to produce fine particles of extremely small dimensions.

Therefore, there is a need for a low cost and efficient method of producing high quality fine or ultra fine particle powder.

SUMMARY OF THE INVENTION

To achieve these and other advantages and in order to overcome the disadvantages of the conventional method in accordance with the purpose of the invention as embodied and broadly described herein, the present invention provides a method of utilizing flame synthesis and non-vacuum physical evaporation to produce high quality fine or ultra fine particle powder.

The present invention provides synthesis of fine or ultra-fine powder particles. When implementing this method, precursor and solvent are chemically mixed with an agitator, so the particles that are produced can all be well matched.

Additionally, the fine or ultra-fine particles will be rapidly synthesized when the well-mixed solution starts burning.

The powder collected retains the following properties:
1. Ultra small particle dimensions, such that they are only observable by a TEM or SEM device.
2. Particle surface energy is higher, thereby resulting in easier melting.
3. Powder can be stored easily in any proper solution.
4. Well-suited for property alteration, such as encapsulation, heterogeneous surface catalysis, etc.
5. The crystal habit of every particle is superbly consistent and much better than the particles produced by other physical processes.

During the burning process, massive well-matched fine particles with burst from the flame or thrust through the flame and become single grains of a superb lattice structure. The structure is far superior in comparison with that produced by conventional sputtering.

Additionally, an object to be plated can be placed at a proper distance over the flame, and massive particles or grains will deposit on the object. This process is the non-vacuum physical evaporation.

In conventional plating processes, only a single metal can be plated onto the object by vacuum evaporation, while a compound of a bimetal or complex metal can only be plated onto the object using expensive sputtering devices. Developing a new sputtering process is laborious, time-consuming, costly, and thus difficult.

Since the fine powder particles synthesized by the process of the present invention retains a better crystal habit, the quality of plating will be higher than that of conventional methods.

Also, since the evaporation is conducted in a non-vacuum environment, the types of materials to be plated can be extended to include metal, glass porcelain, plastics, leather, fabrics, paper, etc. Without the confinement, restrictions, or size limit of a vacuum chamber, objects to be plated can be swiveled and moved. Therefore, an object of very large size or with a contoured surface can be easily plated utilizing the method of the present invention.

Furthermore, because the cost of equipment, for example an evaporation gun, is relatively inexpensive, several pieces of equipment can be operated simultaneously to accelerate the speed of deposition. Thereby, production costs are lowered.

Moreover, the present invention provides faster evaporation which results in increased productivity during mass production. Also, the present invention is safer as the solution won't explode, which sometimes occurs with traditional methods. Additionally, the present invention provides better distribution resulting in higher quality.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
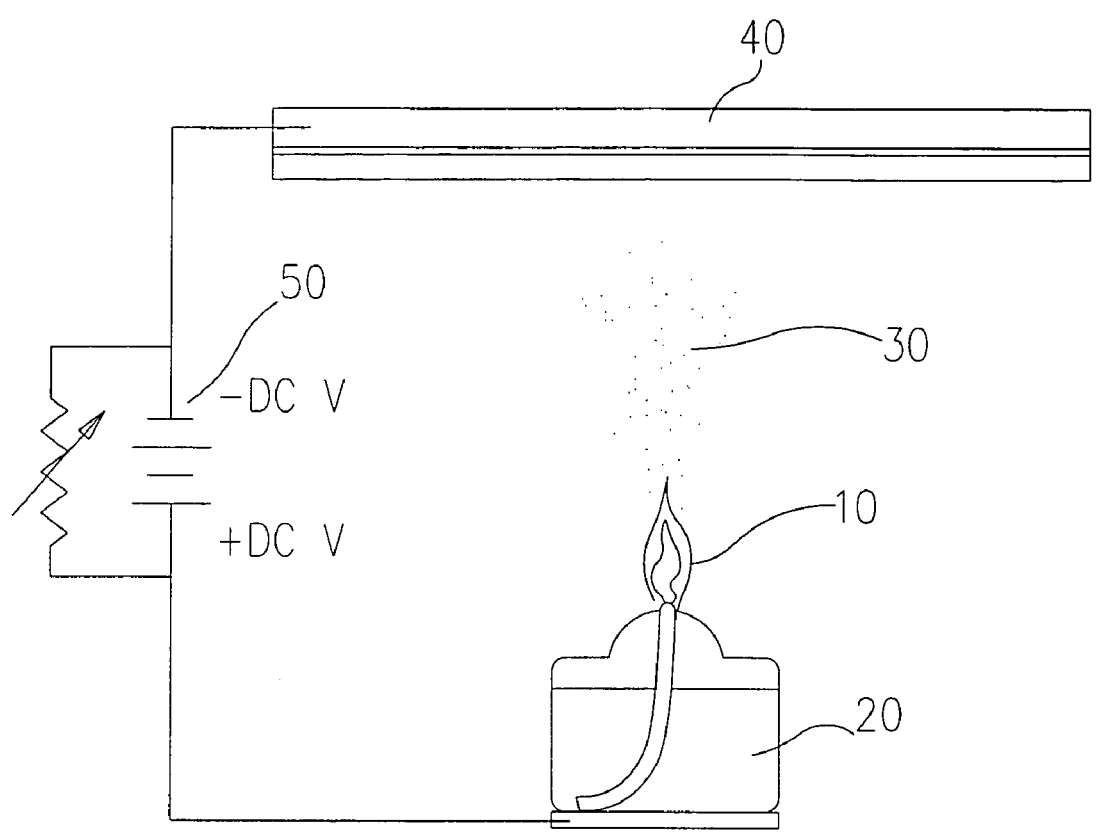
FIG. 1 is a diagram illustrating a method of utilizing flame synthesis and non-vacuum physical evaporation to produce high quality fine or ultra fine particle powder according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The invention comprises mixing a sol-gel with a solvent to create a mixed solution. Then the mixed solution is ignited. While the mixed solution is burning, a self-sustaining flame is created. The self-sustaining flame causes powder particles to be produced from the burning mixed solution.

A non-metal hydride is inducted into an organometallic salt for a compounding reaction. The solution of the compound precursor is mixed with an organic solvent. For purposes of this disclosure, organometallic compounds are intended to comprise metal alkoxides.

React the precursor solvent mixture with an "HnXm", where X is individually replaced by various elements, such as oxygen, sulphur, nitrogen, boron, etc. After the burning process, the powder particles may be metal oxide, metal sulphide, metal nitride, metal borate, etc.

Following are two examples:

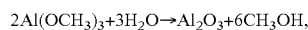

$$2Al(OCH_3)_3 + 3H_2O \rightarrow Al_2O_3 + 6CH_3OH,$$

where X is Oxygen.

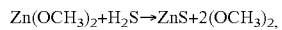

$$Zn(OCH_3)_2 + H_2S \rightarrow ZnS + 2(OCH_3)_2,$$

where X is Sulfur.

If several kinds of organometallic salts are mixed or compounded by agitation and more than one kind of hydride is subsequently inducted into the solution of precursor compounds, powder particles of mixed metal compounds can be obtained after the burning process is completed.

The term chelate, is suggested for the caliperlike groups which function as two associating units and fasten to the central atom so as to produce heterocyclic rings. Chelate is also defined as a compound having a ring structure that usually contains a metal ion held by coordinate bonds. In the invention, the complex metal compound is a chelate, acts as a chelate, or behaves in a manner of a chelate.

Following are some examples, where M equals metallic element and OR equals alkoxyl:

$$M\text{-}OR + HX \rightarrow MX + HOR \quad (1)$$

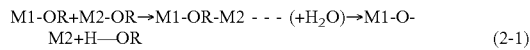

$$M1\text{-}OR + M2\text{-}OR \rightarrow M1\text{-}OR\text{-}M2 \text{ - - - } (+H_2O) \rightarrow M1\text{-}O\text{-}M2 + H\text{---}OR \quad (2\text{-}1)$$

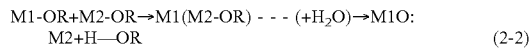

$$M1\text{-}OR + M2\text{-}OR \rightarrow M1(M2\text{-}OR) \text{ - - - } (+H_2O) \rightarrow M1O: M2 + H\text{---}OR \quad (2\text{-}2)$$

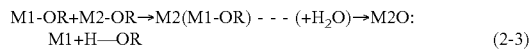

$$M1\text{-}OR + M2\text{-}OR \rightarrow M2(M1\text{-}OR) \text{ - - - } (+H_2O) \rightarrow M2O: M1 + H\text{---}OR \quad (2\text{-}3)$$

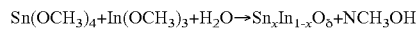

$$Sn(OCH_3)_4 + In(OCH_3)_3 + H_2O \rightarrow Sn_xIn_{1-x}O_6 + NCH_3OH$$

Mixed metal oxides, etc. can also be produced by this method.

Several kinds of organometallic salts can be mixed or compounded by agitation, and more than one kind of hydride may be subsequently inducted into the solution of precursor compound.

A first precursor of organometallic salt and hydride in organic solvent is made ready. Use one or more different types of organometallic salt (focusing on the replacement of various metallic elements) to produce a second precursor. After the solution is completely mixed or compounded by agitation, induct one or more different types of hydride (focusing on the replacement of various non-metallic elements) into the solution and agitate it. The second precursor in organic solvent is also ready after complete agitation.

Then, mix the first precursor solution and the second precursor solution. Completely agitate the combined precursor solution, than proceed to the burning process.

Figure 2:
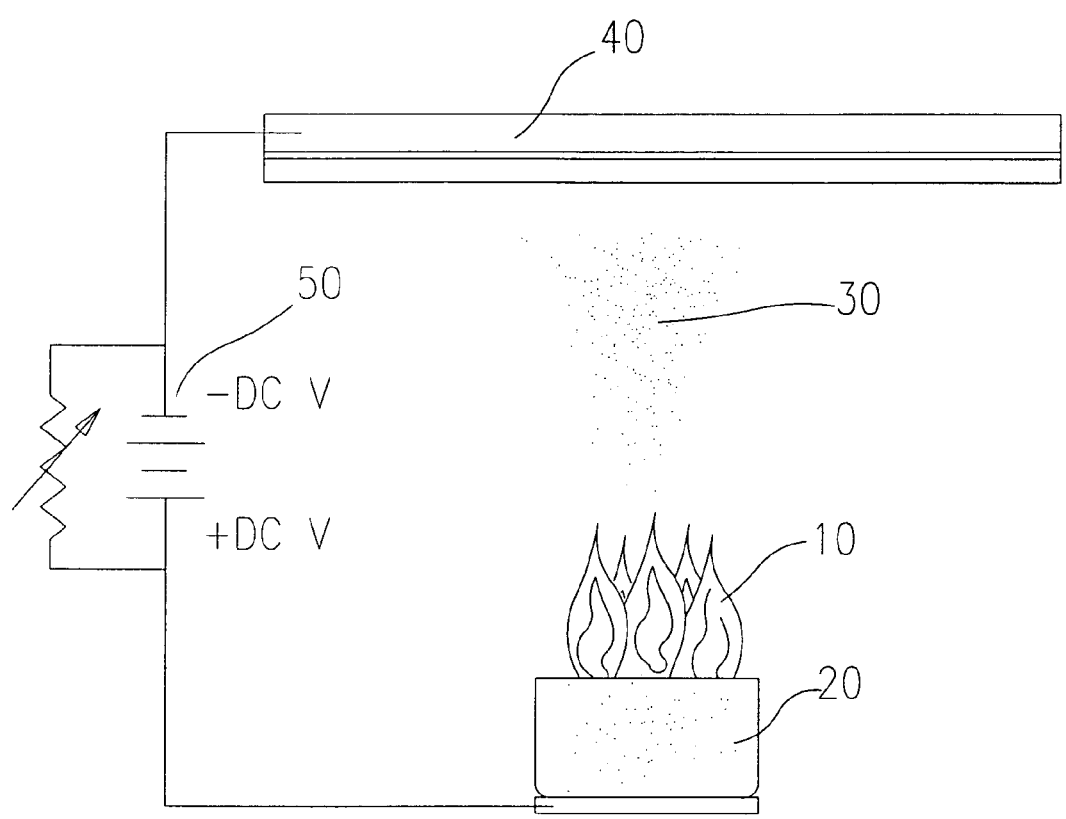
FIG. 2 is a diagram illustrating a method of utilizing flame synthesis and non-vacuum physical evaporation to produce high quality fine or ultra fine particle powder according to an embodiment of the present invention.

Refer to FIG. 1 and FIG. 2, which are diagrams illustrating a method of utilizing flame synthesis and non-vacuum physical evaporation to produce high quality fine or ultra fine particle powder according to an embodiment of the present invention.

The burning process comprises igniting the combined precursor solution 20 directly. A self-sustaining flame 10 will result. When the precursor solution 20 burns, the metallic compound will be co-fired with the organic solvent. The fine or ultra fine particles 30 of mixed metal will burst from the flame, or thrust through the flame and be synthesized. The fine or ultra fine particles 30 of mixed metal are evenly distributed onto the object 40 to be plated or covered.

In an embodiment of the present invention, a power source 50, is provided. Adjusting the electric field controls the speed of the particles emitted.

Since the evaporation is conducted in a non-vacuum environment, the types of materials to be plated can be extended to include metal, glass porcelain, plastics, leather, fabrics, paper, etc. Without the confinement, restrictions, or size limit of a vacuum chamber, objects to be plated can be swiveled and moved. Therefore, an object of very large size or with a contoured surface can be easily plated utilizing the method of the present invention.

Unlike conventional methods such as thermal spraying, whereby a solution is sprayed through a flame, the present invention utilizes direct flame synthesis whereby the combined precursor solution is ignited directly. This results in high quality, fine or ultra-fine particle powder.

Using the direct burning method of the present invention, the particle surface energy is higher than conventional methods and thus melting is easier.

Additionally, using the direct burning method of the present invention, the crystal habit of every particle is superbly consistent and much better than conventional methods such as thermal spraying which tend to be inconsistent due to splaying into the flame.

In an embodiment of the present invention, the solution is burnt in situ. That is to say, after mixing, the solution is ignited and a self-sustaining flame is produced. No movement or spraying of the solution is required. The fine or ultra fine powder particles are formed by the burning or co-firing of the metallic compound with the organic solvent.

Following are examples whereby different ions can easily be inter-dope:

$$Zn(OCH_3)_2 + H_2S \rightarrow ZnS + 2CH_3OH \quad \text{Formula one:}$$

$$Eu(OCH_3)_2 + Dy(OCH_3)_2 \xrightarrow{+H_2O} Eu_xDy_{1-x}O_\delta + CH_3OH \quad \text{Formula two:}$$

$$[ZnS + 2CH_3OH] + [Eu_xDy_{1-x}O_\delta + CH_3OH] \rightarrow ZnS_{1-y}:$$
$$Eu_xDy_{1-x}O_{\delta-\alpha} + CH_3OH \quad \text{Formula one + Formula two:}$$

In this process, a metallic salt or metallic compound can be dissolved in acid or alkali to produce a precursor solution, followed by addition of an organic solvent to produce the solution containing a precursor of a metallic compound and an organic solvent.

Then the burning process is performed on the solution. The burning process comprises igniting the solution directly. A self-sustaining flame will result. When the precursor solution burns, the metallic compound will be co-fired with the organic solvent. As a result, fine or ultra fine particles of mixed metal will burst from the flame, or thrust through the flame and be synthesized.

By dissolving copper oxide powder (crystal phase) in hydrochloric acid, the copper oxide will transform into an ion precursor. This method of producing a metallic compound precursor is also suitable for other metallic salts, such as metal phosphate, metal carbonate, metal sulfate, metal nitrate, etc.

Dissolve a metal halide in an organic solvent, or directly mix the solution of metal halide with a proper solvent to produce the precursor metal halide solution. Proceed with the direct burning process by burning the solution directly. As a result, fine or ultra fine powder particles of metal halide can be produced through the co-firing or direct burning process.

For example, directly dissolve sodium chloride in ethanol and burn this solution, or dissolve sodium chloride in water to produce saturated salt water, then add a massive amount of ethanol into the salt water and burn the mixed solution.

Since the present invention utilizes a physical evaporation process that can be conducted in a non-vacuum environment, the resultant air pollution is extremely low.

Additionally, the present invention uses the atmospheric pressure to force the distribution. The space between air molecules is approximately 65 nm. Therefore, the resultant powder particles are forced to be approximately 50 nm. As a result, the powder retains ultra small particle dimensions, such that they are only observable by a TEM or SEM device. Furthermore, the crystal habit of every particle is superbly consistent and much better than the particles produced by other physical processes.

Therefore, the present invention provides an inexpensive and efficient method of utilizing flame synthesis and non-vacuum physical evaporation to produce high quality fine or ultra fine particle powder.

Utilizing the flame synthesis of the present invention by directly burning the solution causes the particle surface energy to be higher, thereby resulting in easier melting. Additionally, the powder can be stored easily in any proper solution. The invention is well-suited for property alteration, such as encapsulation, heterogeneous surface catalysis, etc. Furthermore, the crystal habit of every particle is superbly consistent and much better than the particles produced by other physical processes. Moreover, the resultant air pollution is extremely low.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A method of forming powder particles, comprising:
   mixing a chelate, at least one non-metallic hydride and an organic solvent to form a mixed solution; and
   igniting the mixed solution directly to create a self-sustaining flame to produce powder particles.

2. The method of claim 1, wherein said chelate is a complex metal compound.

3. The method of claim 1, wherein said chelate comprises at least one metallic composition selected from the group consisting of a metal alkoxide, a metallic salt dissolved in one of an acid or a base, and combinations thereof.

4. The method of claim 1, further comprising:
   utilizing a non-vacuum physical evaporation process to coat a surface of an object, said evaporation process defined as the bursting or thrusting of said powder particles through said self-sustaining flame onto said surface of said object to form an evenly distributed coating.

5. The method claim 1, wherein an amount of organic solvent used is adjusted to control powder particle formation rate.

6. The method of claim 1, wherein said chelate comprises a plurality of metallic compositions to form powder particles of a mixed metal compound.

7. A method of forming powder particles, comprising:
   mixing a chelate, at least one non-metallic hydride and an organic solvent to form a mixed solution;
   igniting the mixed solution directly to create a self-sustaining flame to produce powder particles; and
   utilizing a non-vacuum physical evaporation process to coat a surface of an object said evaporation process being defined as the bursting or thrusting of said powder particles through said self-sustaining flame onto said surface of said object to form an evenly distributed coating.

8. The method of claim 7, wherein said chelate comprises at least one metallic composition selected from the group consisting of a metal alkoxide, a metallic salt dissolved in one of an acid or a base, and combinations thereof.

9. The method of claim 7, wherein an amount of said organic solvent used is adjusted to control powder particle formation rate.

10. The method of claim 7, wherein the non-metallic hydride has a formula HnXm, where H is hydrogen, is equal to the number of hydrogen atoms, X is a non-metal element, and m is equal to the number atoms of said non-metal elements.

* * * * *